United States Patent
Lee

(10) Patent No.: US 11,256,183 B2
(45) Date of Patent: Feb. 22, 2022

(54) DETECTION METHOD AND SYSTEM FOR PELLICLE MEMBRANE OF PHOTOMASK

(71) Applicant: SOUTHERN TAIWAN UNIVERSITY OF SCIENCE AND TECHNOLOGY, Tainan (TW)

(72) Inventor: Yu-Ching Lee, Tainan (TW)

(73) Assignee: SOUTHERN TAIWAN UNIVERSITY OF SCIENCE AND TECHNOLOGY, Tainan (TW)

( * ) Notice: Subject to any disclaimer, the term of this patent is extended or adjusted under 35 U.S.C. 154(b) by 52 days.

(21) Appl. No.: 16/876,148

(22) Filed: May 18, 2020

(65) Prior Publication Data
US 2021/0181619 A1    Jun. 17, 2021

(30) Foreign Application Priority Data

Dec. 13, 2019  (TW) .................................. 108145796
Apr. 8, 2020   (TW) .................................. 109111805

(51) Int. Cl.
*G03F 7/20*    (2006.01)
*G03F 1/62*    (2012.01)

(52) U.S. Cl.
CPC ............ *G03F 7/70983* (2013.01); *G03F 1/62* (2013.01)

(58) Field of Classification Search
CPC ........... G03F 7/70983; G03F 1/62; G03F 1/64
See application file for complete search history.

(56) References Cited

U.S. PATENT DOCUMENTS

| | | | |
|---|---|---|---|
| 10,877,371 B1* | 12/2020 | Lee | G03F 1/84 |
| 2002/0126269 A1* | 9/2002 | Sato | G03F 7/70983 355/77 |
| 2011/0014577 A1* | 1/2011 | Hashimoto | G03F 7/70983 430/325 |
| 2016/0274471 A1* | 9/2016 | Lee | G03F 1/84 |
| 2017/0122913 A1* | 5/2017 | Riviere | G03F 1/84 |

* cited by examiner

*Primary Examiner* — Steven Whitesell Gordon

(57) ABSTRACT

A detection method for a pellicle membrane of a photomask includes applying a predetermined pressure under which the pellicle membrane undergoes a deformation, measuring and calculating at least one of deformation level, Young's modulus, and flexural rigidity level of the pellicle membrane by detection, and obtaining a detection result about the pellicle membrane according to at least one of the deformation level, Young's modulus, and flexural rigidity level of the pellicle membrane, so as to evaluate the quality of the pellicle membrane.

9 Claims, 3 Drawing Sheets

DETECTION METHOD AND SYSTEM FOR PELLICLE MEMBRANE OF PHOTOMASK

CROSS-REFERENCE TO RELATED APPLICATION

This non-provisional application claims priority under 35 U.S.C. § 119(a) on Patent Application No(s). 108145796 and 109111805, filed in Taiwan, R.O.C. on Dec. 13, 2019, and Apr. 8, 2020, respectively, the entire contents of which are hereby incorporated by reference.

BACKGROUND OF THE INVENTION

1. Field of the Invention

The present disclosure relates to a detection method and system for a pellicle membrane of a photomask, and in particular to a detection method and system applied to a pellicle membrane of a photomask by optical detection.

2. Description of the Related Art

The nanoscale pitches of semiconductor chips are increasingly small, as electronic products are becoming smaller, more versatile and more robust.

Consequently, unit area of each chip can carry more transistors to meet nanoscale requirements. However, a lithography process is a crucial technology as to whether the pitches of semiconductor chips can meet nanoscale requirements.

Lithography involves making photomasks from wiring patterns and casting projections of the wirings on wafers coated with photoresists by an optical imaging principle, so as to copy the wiring patterns precisely to the photoresists by photomask pattern irradiation. After that, chips are made from the wafers by development, etching and plating. Therefore, photomask quality is a major factor in the outcome of lithography especially when the process thereof is carried out with deep ultraviolet and extreme ultraviolet.

Referring to FIG. 1, a conventional photomask includes a light-penetrable substrate 11 whose surface has a wiring pattern 111 and a pellicle 12 for covering the wiring pattern 111. The pellicle 12 has an outer frame 121 disposed on the surface of the light-penetrable substrate 11 and surrounding the wiring pattern 111. The outer frame 121 has an opening 122 and a pellicle membrane 123 for covering the top of the outer frame 121 and the wiring pattern 111. The pellicle membrane 123 blocks external particle contaminants which might otherwise contaminate the wiring pattern 111, so as to ensure exposure quality. However, the pellicle membrane 123 is made of organic polymer and thus deteriorates because of its lengthy exposure to ultraviolet, deep ultraviolet or extreme ultraviolet, its vulnerability to an inappropriate process, its contamination by particles, illumination-induced aging or operation-related collisions. Its deterioration leads to poor exposure results and even causes contamination to exposure machines. The exposure machines thus contaminated are likely to fail and thereby affect the productivity of wafer fabrication.

In view of the aforesaid drawbacks of the prior art, there is still room for improvement in photomask-related detection technology.

BRIEF SUMMARY OF THE INVENTION

An objective of the present disclosure is to provide a detection method for a pellicle membrane of a photomask.

To achieve at least the above objective, the present disclosure provides an embodiment of a detection method for a pellicle membrane of a photomask, comprising the steps of: providing a predetermined pressure under which a pellicle membrane of a photomask undergoes a deformation; calculating a deformation level of the pellicle membrane according to an optical signal generated in accordance with the deformation; and comparing the deformation level with a standard deformation value of the pellicle membrane under the predetermined pressure to obtain a detection result about the pellicle membrane.

Another object of the present disclosure further provides another embodiment of a detection method for a pellicle membrane of a photomask, the detection method comprising the steps of: providing a predetermined pressure under which a pellicle membrane of a photomask undergoes a deformation; generating an optical signal in accordance with the deformation to thereby calculate a deformation level of the pellicle membrane; calculating at least one of Young's modulus and flexural rigidity level of the pellicle membrane according to the deformation level; repeating the above steps to obtain at least one of the Young's moduli and flexural rigidity levels of the pellicle membrane under different predetermined pressures; and obtaining a detection result about the pellicle membrane according to at least one of the Young's moduli and flexural rigidity levels of the pellicle membrane.

Yet another object of the present disclosure further provides an embodiment of a detection system for testing a pellicle membrane of a photomask.

The detection system comprises a pressure generating unit and an optical measuring processing unit according to the embodiment of the present disclosure.

The pressure generating unit generates a pressure under which the pellicle membrane undergoes a deformation.

The optical measuring processing unit comprises a light source module, a light receiver and a computation module. The light source module provides light required to illuminate the surface of the pellicle membrane. The light receiver receives an optical signal reflecting off the surface of the pellicle membrane. The computation module calculates at least one of the deformation level, Young's modulus and flexural rigidity level of the pellicle membrane according to the optical signal.

The embodiment achieves advantages as follows: applying a predetermined pressure under which the pellicle membrane undergoes a deformation; calculating at least one of the deformation level, Young's modulus and flexural rigidity level of the pellicle membrane according to an optical signal reflecting off the pellicle membrane which has undergone the deformation; and obtaining a detection result about the pellicle membrane according to the at least one of the deformation level, Young's modulus and flexural rigidity level of the pellicle membrane, so as to evaluate the quality of the pellicle membrane quickly.

BRIEF DESCRIPTION OF THE DRAWINGS

The other features and advantages of the present disclosure are depicted by accompanying drawings as briefly described below.

DETAILED DESCRIPTION OF THE INVENTION

Various embodiments of a detection technique for testing a pellicle membrane of a photomask are provided. The detection technique can be implemented as a detection method for a pellicle membrane of a photomask and implemented as a detection system for testing a pellicle membrane of a photomask.

The detection method for a pellicle membrane of a photomask entails testing a transparent pellicle membrane of a photomask with a detection system to confirm the quality of the pellicle membrane.

Figure 1:
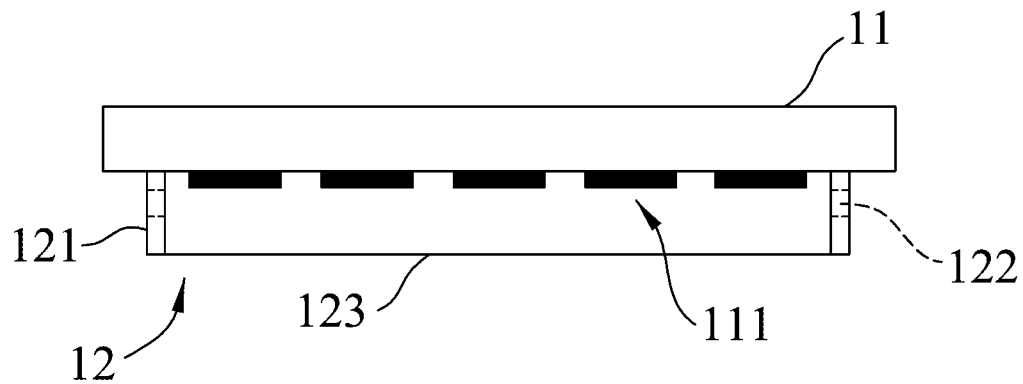
FIG. 1 (PRIOR ART) is a perspective view of a conventional photomask.

A detection method provided by the present disclosure can be applied to various photomasks each comprising a pellicle membrane and a wiring pattern. For instance, the photomask, as shown in FIG. 1, comprises a light-penetrable substrate 11 whose surface has a wiring pattern 111 and a pellicle 12 for covering the wiring pattern 111. The pellicle 12 comprises a frame 121 disposed on the surface of the light-penetrable substrate 11 and surrounding the wiring pattern 111. The frame 121 has an opening 122 and a pellicle membrane 123 for covering the top of the frame 121 and covering the wiring pattern 111. However, implementation of the present disclosure is not limited thereto.

Figure 2:
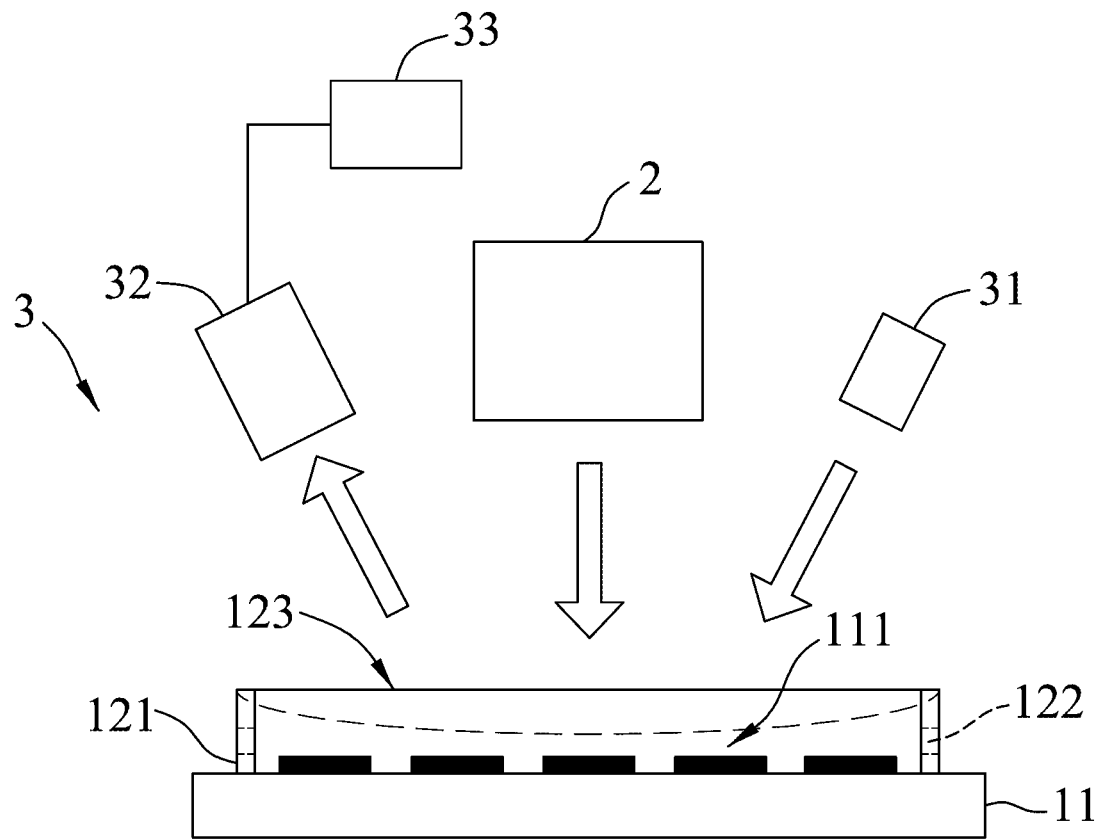
FIG. 2 is a schematic view of a detection system for a detection method according to an embodiment of the present disclosure.
Figure 3:
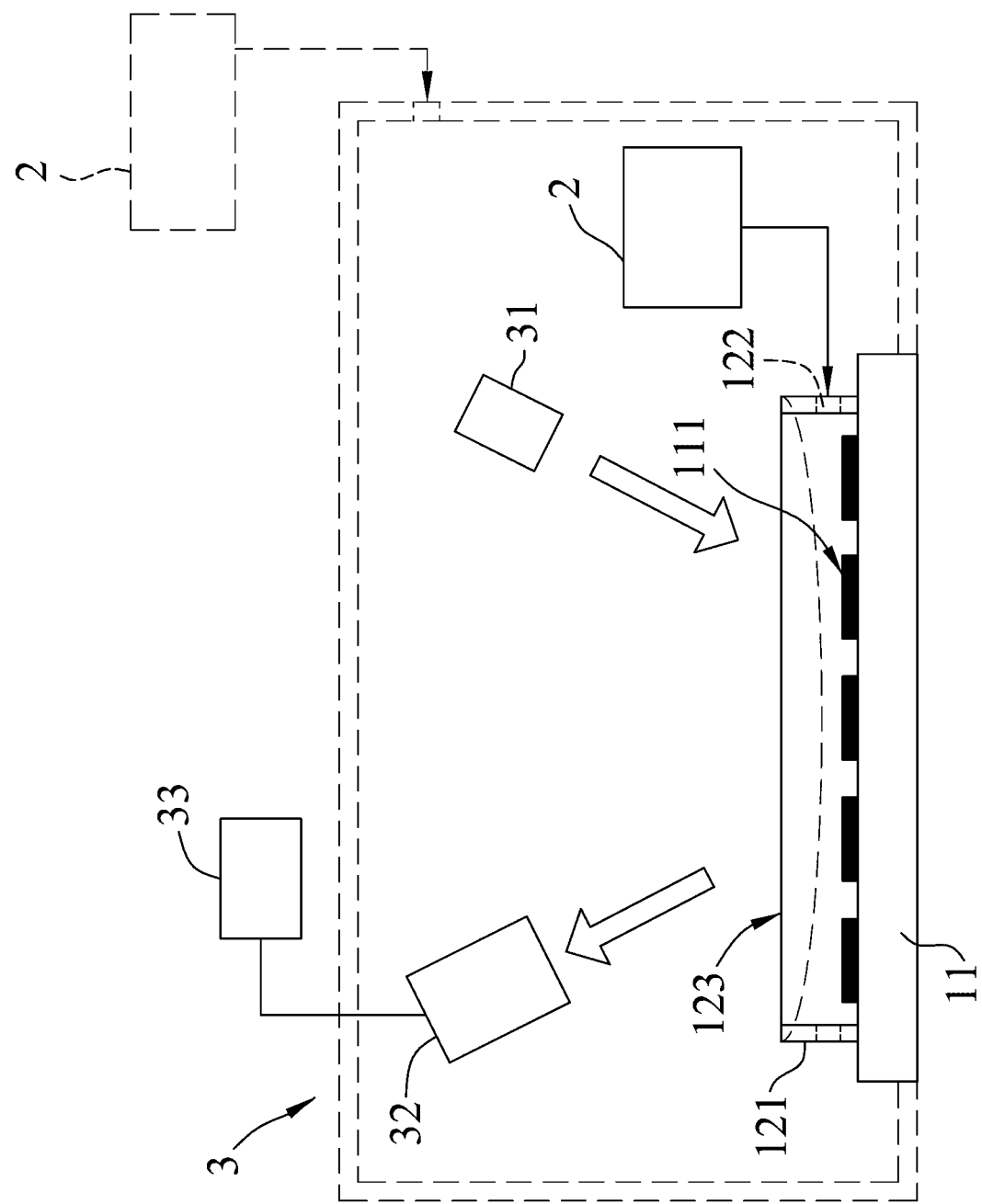
FIG. 3 is a schematic view of the detection system for the detection method according to another embodiment of the present disclosure.

Various ways of implementation of the detection system are described below. Referring to FIGS. 1-3, the detection system comprises a pressure generating unit 2 and an optical measuring processing unit 3.

The pressure generating unit 2 provides the pressure under which the transparent pellicle membrane 123 undergoes a deformation. Specially speaking, the pressure generating unit 2 is an air exhauster or a compressor for controlling the pressure and flow of ejected gas and thereby provides a positive pressure or negative pressure under which the transparent pellicle membrane 123 undergoes a deformation. For instance, as shown in FIG. 2, the way of applying pressure by using the pressure generating unit 2 can be implemented by controlling the pressure and flow of the gas ejected from the pressure generating unit 2 to allow the gas to be ejected from the outer surface of the pellicle membrane 123, thereby allowing the pellicle membrane 123 to undergo a deformation. In addition, as shown in FIG. 3, the speed and flow of the gas extracted from the pressure generating unit 2 can be controlled in such a manner to allow the gas to be extracted through the opening 122 of the frame 121, thereby providing a negative pressure under which the pellicle membrane 123 undergoes a deformation. The negative pressure, under which the pellicle membrane 123 deforms, is generated by extracting air with the pressure generating unit 2 through the opening 122 or extracting air with the pressure generating unit 2 through a vent of a closed space which the photomask is disposed in. To the same end, alternatively, the air can be blown through the opening 122 of the frame 121 through the pressure generating unit 2 to provide a positive pressure that deforms the pellicle membrane 123.

Referring to FIG. 2, in an embodiment, the pressure generating unit 2, which ejects gas toward the pellicle membrane 123 to cause the pellicle membrane 123 to undergo a deformation, has a nozzle. However, the present disclosure is not restrictive of the quantity of the nozzle. For example, in practice, the pressure generating unit 2 may have one or more nozzles.

The optical measurement unit 3 comprises a light source module 31, a light receiver 32 and a computation module 33.

The light source module 31 generates light for illuminating the transparent pellicle membrane 13 which has undergone a deformation. Then, the light receiver 32 receives an optical signal reflecting off the surface of the transparent pellicle membrane 13 which has deformed as a result of its illumination by the light source module 31. The computation module 33 is in signal connection with the light receiver 32 and performs computation in accordance with the optical signal received by the light receiver 32 to obtain a deformation level of the pellicle membrane 123.

In an embodiment, the light source module 31 comprises an LED and a filter, or a laser generator capable of generating laser with adjustable wavelength. Alternatively, the light source module 31 comprises an LED, a laser generator capable of generating laser with adjustable wavelength, an optical expander and a mechanical assembly of lens elements. In an embodiment, the light receiver 32 comprises CCD or CMOS and receives an optical signal reflecting off the pellicle membrane 123 as a result of its illumination by the light source module 31. In a variant embodiment, the computation module 33 is a computation circuit, such as CPU, computer, calculator or any computation-related or programmable circuit, which is in signal connection with the light receiver 32. The computation module 33 performs computation on an optical signal (for example, reflection moiré or resonance moiré which is generated as a result of the reflection) received from the light receiver 32 to obtain the deformation level of the pellicle membrane 123.

In an embodiment, the calculation of the deformation level, Young's modulus, and flexural rigidity level of the pellicle membrane 123 is adjustable, depending on whether the pressure provided by the pressure generating unit 2 is a positive pressure or negative pressure.

Generally speaking, after the elastic thin plate is subjected to an external force, the strain energy generated can be expressed by the following formula (I):

$$U = \frac{1}{2}\int\int_V\int(\sigma_x\varepsilon_x + \sigma_y\varepsilon_y + \sigma_z\varepsilon_z + \tau_{xy}\gamma_{xy} + \tau_{xz}\gamma_{xz} + \tau_{yz}\gamma_{yz})dxdydz \quad \text{(I)}$$

When the pressure generating unit 2 performs gas extraction or blowing, the pellicle membrane 123 can be regarded as a thin plate with its four edges fixed in place so as to bear pressure from the x, y directions. The strain energy U for the pellicle membrane 123 can be expressed by the following formula (II):

$$U = \frac{1}{2}\int\int_A D\left\{\left(\frac{\partial^2 w}{\partial x^2} + \frac{\partial^2 w}{\partial y^2}\right)^2 - 2(1-v)\left[\frac{\partial^2 w}{\partial x^2}\frac{\partial^2 w}{\partial y^2} - \left(\frac{\partial^2 w}{\partial x \partial y}\right)^2\right]\right\}dxdy \quad \text{(II)}$$

wherein A is the surface area of the pellicle membrane 123, w is the deformation amount of the thin plate, and D is the flexural rigidity. The flexural rigidity D can be expressed by the following formula (III):

$$D = \frac{Eh^3}{12(1-v^2)} \quad \text{(III)}$$

wherein v denotes Poisson's ratio; h denotes the thickness of the pellicle membrane 123; and E denotes Young's modulus.

In addition, the work (W) made by applying pressure (p(x, y)) to the surface of the pellicle membrane 123 can be expressed by formula (IV):

$$W = \iint_A wp \, dx \, dy \quad \text{(IV)}$$

Hence, the total energy T for the pellicle membrane 123 can be expressed by formula (V):

$$T = U - W \quad \text{(V)}$$

Assuming that the fixed lengths a and b of the pellicle membrane 123 satisfy the boundary conditions, the amount of deformation (w) can be expressed by the following formula (VI):

$$w = \sum_{m=1}^{\infty}\sum_{n=1}^{\infty} a_{mn}\left(1 - \cos\frac{2m\pi x}{a}\right)\left(1 - \cos\frac{2n\pi y}{b}\right) \quad \text{(VI)}$$

wherein a and b are the length and width of the pellicle membrane 123, m and n are the deformation modes of the pellicle membrane 123, and $a_{min}$ is the deformation coefficient of the thin plate.

In addition, for $a_{min}$, by substituting the above formulas (II), (IV), (VI) into (V), and the formula (VII) is obtained under the condition that the minimization condition $$\frac{\partial T}{\partial a_{mn}} = 0$$

is satisfied.

$$4D\pi^4 ab\left\{\left[3\left(\frac{m}{a}\right)^4 + 3\left(\frac{n}{b}\right)^4 + 2\left(\frac{m}{a}\right)^2\left(\frac{n}{b}\right)^2\right]a_{mn} + \sum_{r=1}^{\infty}2\left(\frac{m}{a}\right)^4 a_{mr} + \sum_{r=1}^{\infty}2\left(\frac{n}{b}\right)^4 a_{rn}\right\} - p_0 ab = 0 \quad \text{(VII)}$$

wherein $P_0$ is the internal and external pressure difference of the pellicle membrane 123, and r≠m, r≠n.

By removing all terms of the formula (VII) except for $a_{11}$, the formula (VII) can be solved to obtain the formula (VIII):

$$a_{11} = \frac{p_0 a^4}{4D\pi^4}\frac{1}{3 + 3(a/b)^4 + 2(a/b)^2} \quad \text{(VIII)}$$

After that, substituting formula (VIII) into the formula (VI) to obtain the deformation formula (D) of the pellicle membrane 123 when pressure is applied to the pellicle membrane 123 by gas blowing or extraction through the opening 122:

$$w = \frac{p_0 a^4}{4D\pi^4}\frac{1}{3 + 3(a/b)^4 + 2(a/b)^2}\left(1 - \cos\frac{2\pi x}{a}\right)\left(1 - \cos\frac{2\pi y}{b}\right) \quad \text{(D)}$$

From the formula (D), the maximum out of plane deformation (w) of the center of the pellicle membrane 123 (x=a/2, y=b/2) can be obtained:

$$w = \frac{p_0 a^4}{D\pi^4}\frac{1}{3 + 3(a/b)^4 + 2(a/b)^2}$$

Further, when the pressure generating unit 2 is used to apply pressure to the thin plate (e.g., the pellicle membrane 123)(i.e., the pressure provided by the pressure generating unit 2 is a positive pressure), the pellicle membrane 123 can be regarded as whose rated load (P(x,y)) per unit area (P(x,y)) is a constant. Hence, the work (W') made by applying pressure (P(x1, y1)) to the surface of the pellicle membrane 123 can be expressed by the formula (IV')

$$W' = P\sum_{m=1}^{\infty}\sum_{n=1}^{\infty} a_{mn}\left(1 - \cos\frac{2m\pi x_1}{a}\right)\left(1 - \cos\frac{2n\pi y_1}{b}\right) \quad \text{(IV')}$$

wherein P is the pressure applied to the pellicle membrane 123, and the remaining variables have the same meaning as above indicated.

By substituting the formulas (II) and (IV') into the formula (V), and when the minimization condition $$\frac{\partial T}{\partial a_{mn}} = 0$$

is satisfied, formula (VII') can be obtained:

$$4D\pi^4 ab\left\{\left[3\left(\frac{m}{a}\right)^4 + 3\left(\frac{n}{b}\right)^4 + 2\left(\frac{m}{a}\right)^2\left(\frac{n}{b}\right)^2\right]a_{mn} + \sum_{r=1}^{\infty}2\left(\frac{m}{a}\right)^4 a_{mr} + \sum_{r=1}^{\infty}2\left(\frac{n}{b}\right)^4 a_m\right\} - P\left(1 - \cos\frac{2m\pi x_1}{a}\right)\left(1 - \cos\frac{2n\pi y_1}{a}\right) = 0 \quad \text{(VII')}$$

wherein r≠m and r≠n.

By removing all terms except for $a_{11}$ from the formula (VII'), $a_{11}$ can be obtained by solving the formula (VII'). Then, by the same calculation method as above, the maximum out-of-plane deformation amount (w) of the center (x=a/2, y=b/2) of the pellicle membrane 123 when pressure is directly applied to the surface of the pellicle membrane 123 can be obtained as follows.

$$w = \frac{Pa^3}{D\pi^4 b}\frac{1}{3 + 3(a/b)^4 + 2(a/b)^2}$$

Figure 4:
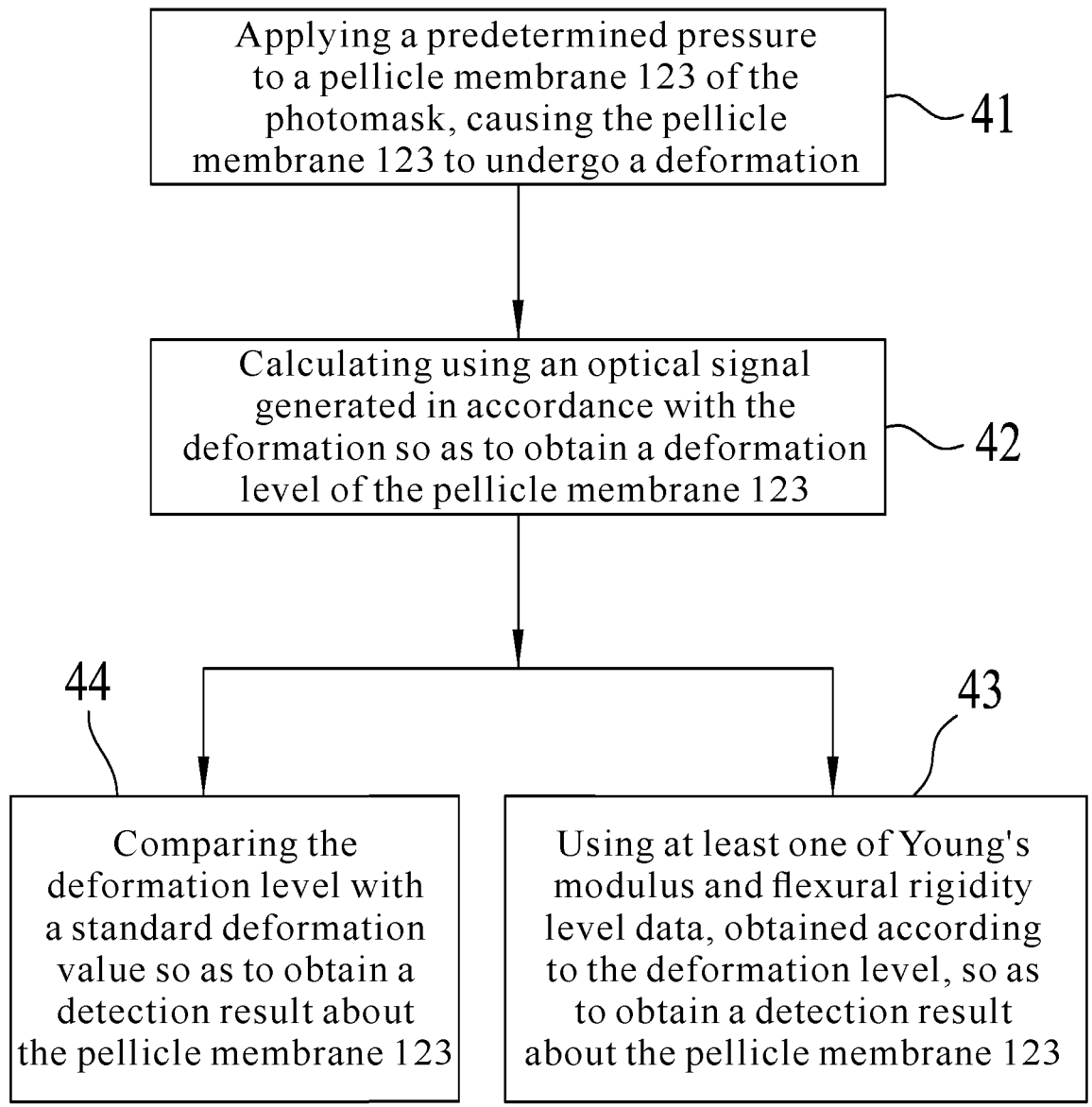
FIG. 4 is a flowchart of the detection method according to an embodiment of the present disclosure.

Referring to FIG. 4, there is shown a flowchart of the detection method according to an embodiment of the present disclosure. The process of performing the detection method with the detection system in an embodiment of the present disclosure starts with step 41. In step 41, the pressure generating unit 2 applies a predetermined positive pressure or negative pressure to the pellicle membrane 123 of the photomask, thereby causing the pellicle membrane 123 to undergo a deformation.

Then, in step 42, an optical signal is generated in accordance with the deformation, thereby calculating a deformation level of the pellicle membrane 123.

For instance, in the step 42, the light source module 31 illuminates the surface of the pellicle membrane 123 which has undergone a deformation, and then the light receiver 32 receives a reflection signal generated as a result of the illumination of the surface of the pellicle membrane 123 by the light source module 31. After that, a deformation level, the Young's modulus and the flexural rigidity level of the pellicle membrane 123 can be calculated by using the computation module 3 according to how the pressure generating unit 2 applies the pressure.

In step 43 and/or step 44, at least one of the deformation level, Young's modulus and flexural rigidity level of the pellicle membrane 123 is calculated in order to evaluate the quality of the pellicle membrane 123 and obtain the detection result about the pellicle membrane 123.

For instance, in step 43, testing the pellicle membrane 123 according to the deformation level entails comparing the deformation level (w1) of the pellicle membrane 123 subjected to the predetermined pressure with a standard deformation value (W0) of the pellicle membrane 123 under the predetermined pressure condition to obtain a detection result about the transparent pellicle membrane. For example, if the error of the result of comparison of the deformation level (w1) and the standard deformation value (W0) falls within a process tolerance range, it will indicate that the pellicle membrane 123 is of high quality. If the error of the result of comparison of the deformation level (w1) and the standard deformation value (W0) falls outside a process tolerance range, it will indicate that the pellicle membrane 123 has deteriorated and thus must be replaced.

For instance, in step 44: testing the pellicle membrane 123 according to the Young's modulus (E) or flexural rigidity level (D) entails repeating the steps 41~42 to obtain the Young's moduli (E) or flexural rigidity levels (D) of the pellicle membrane 123 deformed under different pressures and then plotting curves of the Young's moduli (E) or flexural rigidity levels (D) against the applied pressure. In general, the curves thus plotted demonstrate constant or linear relationship between the Young's modulus (E) or flexural rigidity level (D) of a polymeric pellicle membrane and the applied pressure. Consequently, if the curves thus plotted show a deviation from the original constant or linear relationship between the Young's modulus (E) or flexural rigidity level (D) of the pellicle membrane 123 under different pressures and the applied pressure, it will confirm that the pellicle membrane 123 has deteriorated. Furthermore, the variance tolerance of the deviation can be defined by the system or the user to serve as a test criterion for determining whether to replace the pellicle membrane 123.

In conclusion, the embodiment entails applying a force under which the pellicle membrane (for example, pellicle membrane 123) undergoes a deformation, measuring and calculating at least one of the deformation level, Young's modulus, and flexural rigidity level of the pellicle membrane by optical detection, and obtaining a detection result about the pellicle membrane according to at least one of the deformation level, Young's modulus, and flexural rigidity level of the pellicle membrane, so as to not only perform measurement easily and quickly but also evaluate and monitor the quality of the pellicle membrane quickly.

While the present disclosure has been described by means of specific embodiments, numerous modifications and variations could be made thereto by those skilled in the art without departing from the scope and spirit of the present disclosure set forth in the claims.

What is claimed is:

1. A detection method for a pellicle membrane of a photomask, comprising the steps of:
providing a predetermined pressure under which a pellicle membrane of a photomask undergoes a deformation through gas extraction or blowing;
calculating a deformation level of the pellicle membrane according to an optical signal generated in accordance with the deformation, wherein the deformation level is calculated according to surface reflection moiré received by a light receiver from the pellicle membrane having undergone the deformation; and
comparing the deformation level with a standard deformation value of the pellicle membrane under the predetermined pressure to obtain a detection result about the pellicle membrane, wherein if a result of comparison of the deformation level and the standard deformation value falls within a process tolerance range, it indicates that the pellicle membrane is of high quality; and if the result of comparison of the deformation level and the standard deformation value falls outside the process tolerance range, it indicates that the pellicle membrane has deteriorated.

2. The detection method of claim 1, wherein the pressure is a positive pressure or a negative pressure.

3. The detection method of claim 1, wherein the photomask comprises a light-penetrable substrate whose surface has a wiring pattern, a frame surrounding the wiring pattern and having an opening, and the pellicle membrane for covering a top surface of the frame and covering the wiring pattern, wherein air is drawn through the opening to provide a negative pressure under which the pellicle membrane undergoes the deformation or provide a positive pressure under which the pellicle membrane undergoes the deformation from a surface of the pellicle membrane, and the surface of the pellicle membrane faces away from the substrate.

4. A detection method for a pellicle membrane of a photomask, comprising the steps of:
providing a predetermined pressure under which a pellicle membrane of a photomask undergoes a deformation through gas extraction or blowing;
generating an optical signal in accordance with the deformation to thereby calculate a deformation level of the pellicle membrane, wherein the deformation level is calculated according to surface reflection moiré received by a light receiver from the pellicle membrane having undergone the deformation;
calculating at least one of Young's modulus and flexural rigidity level of the pellicle membrane according to the deformation level;
repeating the above steps to obtain at least one of the Young's moduli and flexural rigidity levels of the pellicle membrane under different predetermined pressures; and
obtaining a detection result about the pellicle membrane according to at least one of the Young's moduli and flexural rigidity levels of the pellicle membrane, wherein relationships of at least one of the Young's moduli and flexural rigidity levels of the pellicle membrane against the applied pressure are determined; if the relationships thus determined show a deviation from a constant or linear relationship between the Young's modulus or flexural rigidity level of the pellicle membrane under different pressures and the applied pressure, it is confirmed that the pellicle membrane has deteriorated.

5. The detection method of claim 4, wherein the pressure is a positive pressure or a negative pressure.

6. The detection method of claim 4, wherein the photomask comprises a light-penetrable substrate whose surface has a wiring pattern, a frame surrounding the wiring pattern and having an opening, and the pellicle membrane covering the frame top surface and the wiring pattern, wherein air is extracted through the opening to provide a negative pressure under which the pellicle membrane deforms or provide from a surface of the pellicle membrane a positive pressure under which the pellicle membrane deforms, wherein the surface of the pellicle membrane faces away from the substrate.

7. A detection system for testing a pellicle membrane of a photomask, comprising:
   a pressure generating unit for generating a pressure under which the pellicle membrane undergoes a deformation through gas extraction or blowing; and
   an optical measuring processing unit comprising a light source module, a light receiver, and a computation module, the light source module providing a light beam for illuminating a surface of the pellicle membrane, the light receiver receiving an optical signal reflecting off the surface of the pellicle membrane, the computation module calculating a deformation level of the pellicle membrane according to the optical signal, wherein the deformation level is calculated according to surface reflection moiré received by the light receiver from the pellicle membrane having undergone the deformation, and the computation module calculates at least one of Young's modulus and flexural rigidity level of the pellicle membrane according to the deformation level, wherein relationships of at least one of the Young's moduli and flexural rigidity levels of the pellicle membrane against the applied pressure are determined; if the relationships thus determined show a deviation from a constant or linear relationship between the Young's modulus or flexural rigidity level of the pellicle membrane under different pressures and the applied pressure, it is confirmed that the pellicle membrane has deteriorated.

8. The detection system of claim 7, wherein the pressure generating unit provides a positive pressure or a negative pressure.

9. The detection system of claim 7, wherein the light receiver comprises CCD or CMOS.

* * * * *